United States Patent [19]

Huang et al.

[11] Patent Number: 5,371,403

[45] Date of Patent: Dec. 6, 1994

[54] HIGH PERFORMANCE PACKAGE USING HIGH DIELECTRIC CONSTANT MATERIALS FOR POWER/GROUND AND LOW DIELECTRIC CONSTANT MATERIALS FOR SIGNAL LINES

[75] Inventors: Chin-Ching Huang; Elizabeth C. Galindo, both of San Jose, Calif.

[73] Assignee: VLSI Technology, Inc., San Jose, Calif.

[21] Appl. No.: 126,250

[22] Filed: Sep. 24, 1993

[51] Int. Cl.⁵ .................. H01L 39/02; H01L 23/02
[52] U.S. Cl. ................................ 257/691; 257/705; 257/701
[58] Field of Search ............... 257/691, 702, 703, 700, 257/698, 701, 705; 333/247; 174/52.4

[56] References Cited

U.S. PATENT DOCUMENTS

| | | |
|---|---|---|
| 4,945,399 | 7/1990 | Brown et al. |
| 5,067,005 | 11/1991 | Michii et al. |
| 5,089,881 | 2/1992 | Panicker ............................ 257/691 |
| 5,162,264 | 11/1992 | Haug et al. |
| 5,177,594 | 1/1993 | Chance et al. |

OTHER PUBLICATIONS

"High-Frequency Bypass and Decoupling Design", Laudie Doubrava, Tektronic, Proceedings of Powercon5, Fifth National Solid-State Power Conversion Conference, May 1978, pp. iii–iv, H1-1–H1-11.
"Ceramics in Microelectronic Packaging", Rao R. Tummala, IBM Research Div., Amer. Ceramic Bulletin, vol. 67, No. 4, 752–758, Jan. 28, 1988.

*Primary Examiner*—Sara W. Crane
*Assistant Examiner*—S. V. Clark
*Attorney, Agent, or Firm*—Majestic, Parsons, Siebert & Hsue

[57] ABSTRACT

A multi-layer package for semiconductor dies using two different types of dielectric materials improves the performance of a semiconductor package. The first material having a high dielectric constant is placed between the power and ground planes to form a decoupling capacitor and the second material having a low dielectric constant is used to contact the signal traces. Silicon carbide is preferred for the high dielectric constant material.

16 Claims, 3 Drawing Sheets

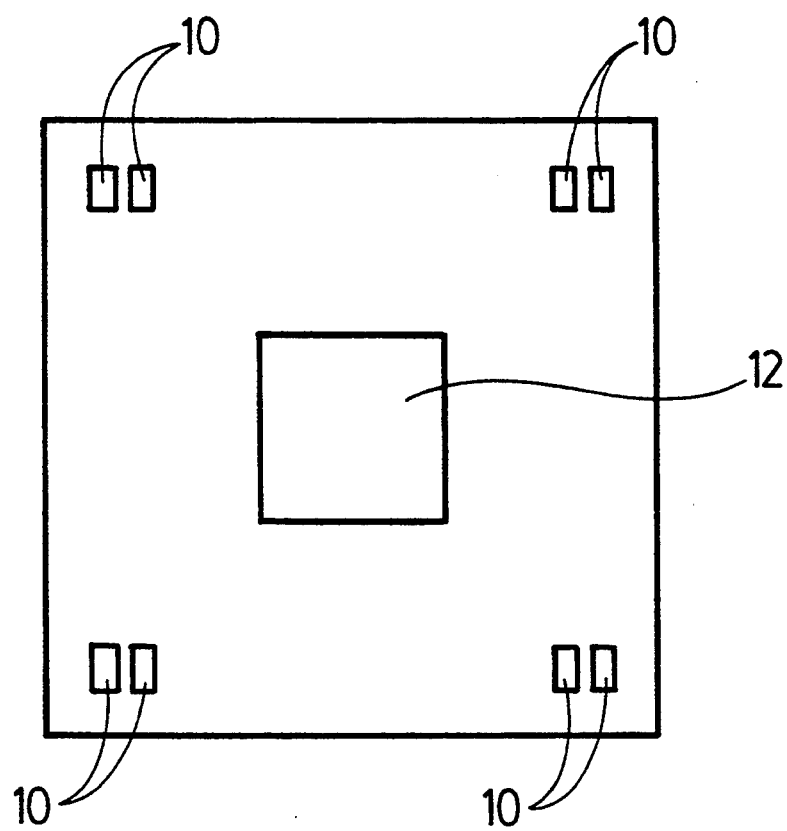
FIG._1.
(BACKGROUND ART)

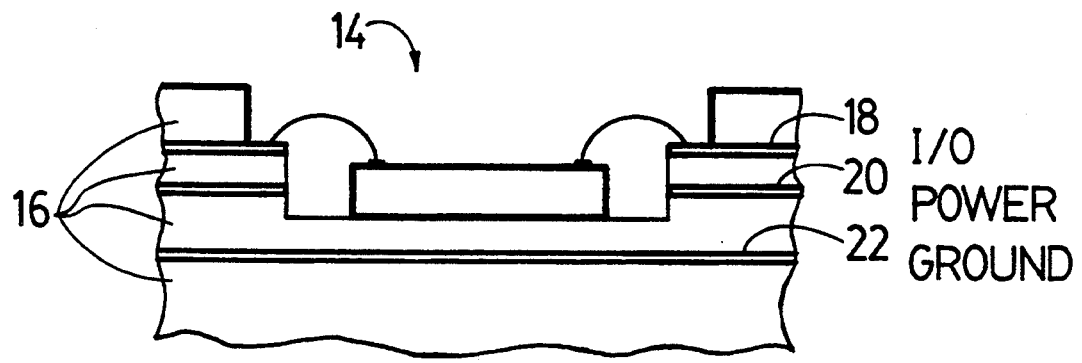
FIG._2.
(BACKGROUND ART)
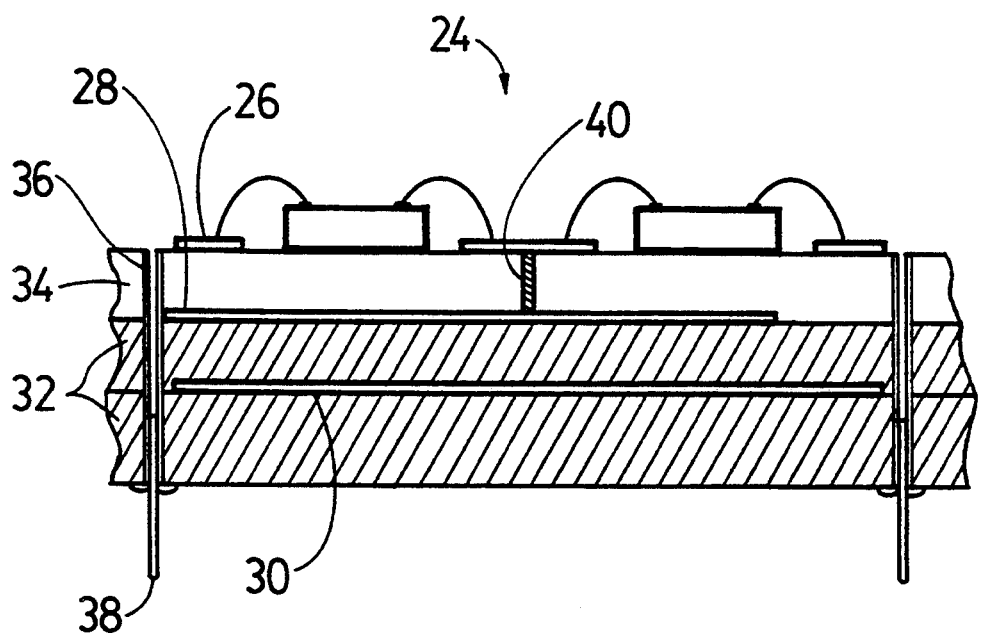
FIG._3.

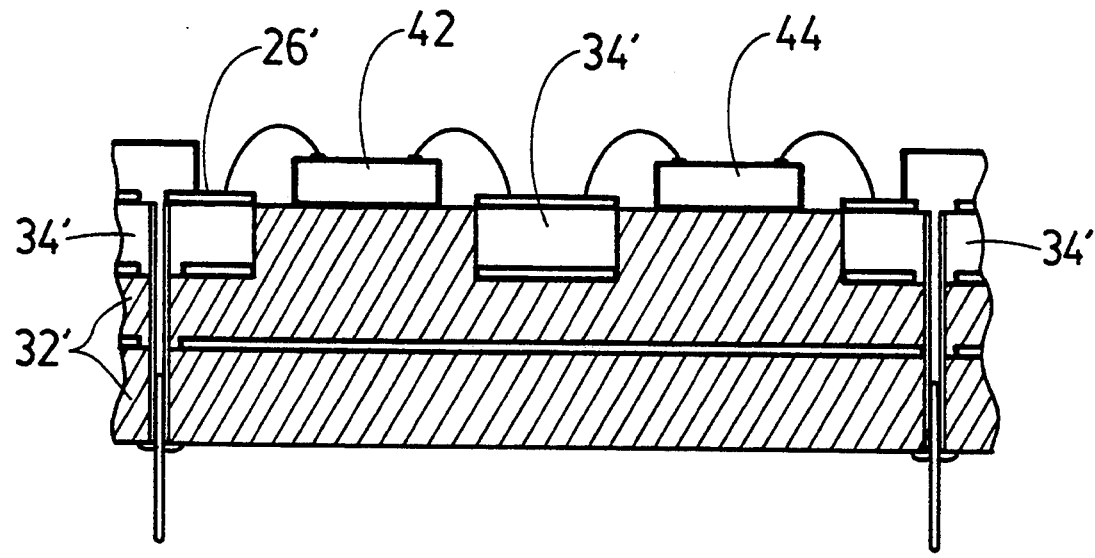
FIG._4.
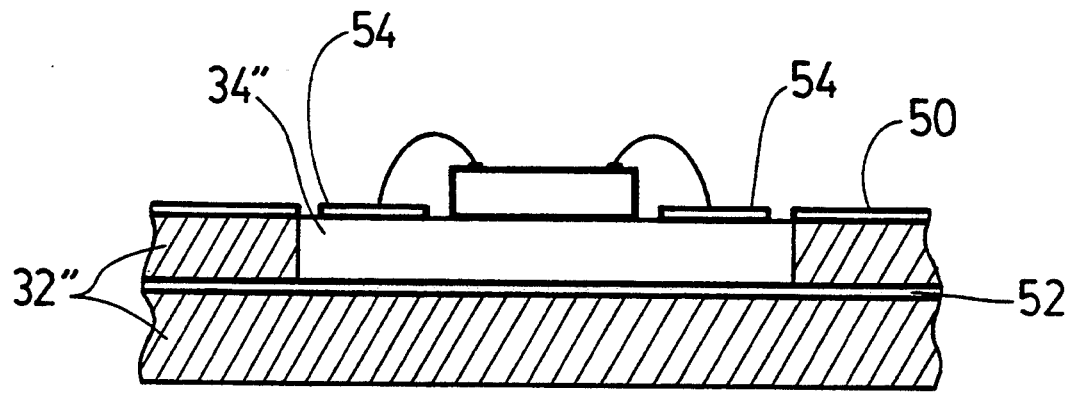
FIG._5.

HIGH PERFORMANCE PACKAGE USING HIGH DIELECTRIC CONSTANT MATERIALS FOR POWER/GROUND AND LOW DIELECTRIC CONSTANT MATERIALS FOR SIGNAL LINES

BACKGROUND OF THE INVENTION

This invention relates to the use of decoupling capacitors between the power and the ground planes on a multilayer package.

Decoupling capacitors are often used in semiconductor packages. A decoupling capacitance between the power and the ground planes can reduce the amplitude of the transient voltage on the voltage supply. The transient voltages are caused by current spikes which occur when transistors on the semiconductor circuit switch on or off.

The article "High Frequency Bypass and Decoupling Design", Laudie Doubrava, Proceedings of PowerCon 5., p. H1-1 through H1-11, gives the equation for the maximum transient voltage due to a current surge to be:

$$V_P = I_P \sqrt{\frac{L}{C_L}}$$

, where L is the total inductance seen by the current source, $I_P$ is the peak current demand and $C_L$ is the decoupling capacitance. This equation shows that the greatest transient voltage decreases as the decoupling capacitance is increased.

In multi-layer packages, especially in ceramic packages, a dielectric material separates the power and ground plane. This dielectric material has a certain capacitance depending on the material's dielectric constant. Dielectric materials used in traditional packages include FR4 with a dielectric constant, $\epsilon_r=4.2$; polyimide with a dielectric constant, $\epsilon_r=4$; alumina with dielectric constant, $\epsilon_r=10$; and aluminum nitrate (AlN) with a dielectric constant, $\epsilon_r=8.5$. The decoupling capacitance between the power and ground plane on a multilayer package with a standard package geometry is about 500 pF using FR4 and about 1,000 pF using alumina. These dielectric materials do not effectively decouple the noise or transient voltage between the power and ground plane. As a result, chip capacitors are typically added to the back side of the package to enhance the decoupling capacitance.

FIG. 1 shows a top diagramic view of a background art package with external chip capacitors. One difficulty with this type of external chip capacitor is that vias must be formed into the package down to the power and ground planes for each of the external decoupling capacitors. Additionally, as shown in FIG. 1, the chip capacitor locations 10 are some distance from the die location 12. Yield problems may occur as a result of added inductance of the traces connecting the distant chip capacitors to the die.

It is an object of the present invention to have an improved package with an increased decoupling capacitance. It is another object of the present invention to have an improved package that does not use external decoupling capacitors.

SUMMARY OF THE INVENTION

The present invention involves using two different types of materials in a semiconductor package. One type of material has a high dielectric constant and is placed between the power and ground plane so that the package has a relatively high decoupling capacitance. The other type of material has a relatively low dielectric constant and is placed near the signal traces so that the signals on the signal traces will not interfere with each other.

In accordance with the principals of the present invention, the above and other objectives are realized by using a multi-layer package with leads or pads. The multi-layer package comprises conductive planes including a power plane electrically connected to a power lead or pad of the package and a ground plane electrically connected to the ground lead or pad of the package, signal traces electrically connected to signal leads or the pads of the package, a first material arranged between and contacting the power plane and the ground plane and the first material having a dielectric constant greater than twenty, and a second material supporting said signal traces, said second material having a dielectric constant of less than twenty.

In one preferred embodiment, the first material is silicon carbide.

In addition, in accordance with the principles of the present invention, the above and other objectives are realized by using a method of forming a multilayer package for semiconductor device. The method comprises forming a substrate layer, forming a first conductive layer on the surface of the substrate layer, forming a separation layer out of a first material having a dielectric constant greater than twenty, forming a second conductive plane on said separation layer, and forming signal traces on a second material having a dielectric constant less than twenty.

BRIEF DESCRIPTION OF THE DRAWINGS

The above and other features and aspects of the present invention will become more apparent upon the reading of the following detailed description in conjunction with the accompanying drawings, in which:

FIG. 1 is a top diagramic view showing the location of the external chip capacitors and die on a package.

FIG. 2 is a partial cross sectional view of a background art package.

FIG. 3 is a partial cross sectional view of the package of the present invention.

FIG. 4 is a partial cross sectional view of the package of another embodiment of the present invention.

FIG. 5 is a partial cross sectional view of the package of yet another embodiment of the present invention.

DETAILED DESCRIPTION OF THE PREFERRED EMBODIMENT

FIG. 2 is a partial cross sectional view of a background art multilayer package. Typically, the package 14 is formed of one type of material 16. This material may be for example, alumina, polyimide, or FR4. Within the multi-layer package 14 are I/O planes 18, power plane 20 and ground plane 22. As discussed above, the dielectric material between the power plane 20 and the ground plane 22 does have a decoupling capacitance. However, since the materials such as alumina, polyimide or FR4 have a dielectric constant of about ten or less, the decoupling capacitance formed within the package between the power and the ground planes may not be large enough to effectively decouple the package. Additionally, using a material with a larger dielectric constant instead of the material 16 may not be practical because the material with a larger dielectric constant would surround the I/O or signal traces and may reduce the package's performance.

FIG. 3 is a partial cross sectional view of the package of the present invention. This package 24 includes signal traces 26, power plane 28 and ground plane 30. Note that between the power plane 28 and the ground plane 30, there is a dielectric material 32 with a relatively high dielectric constant.

The capacitance value of a parallel-plate capacitor can be expressed as $C = \epsilon_r \times A/D$, where C is the capacitance in farads, A is the area of one of the capacitor plates in square meters and D is the distance between in meters between the plates. Using a dielectric material between the power and ground plane with a higher dielectric constant, $\epsilon_r$, increases the decoupling capacitance. The dielectric material 34 contacting the signal traces 26 however, can be of a lower dielectric constant material. In the preferred embodiment, the dielectric material 32 between the power and ground plane has a dielectric constant greater than 20 and the dielectric material contacting the signal trace 26 has a dielectric constant of less than 20. The material 32 is preferably silicon carbide which is available from the Kyocera company of Japan. Silicon carbide has a dielectric constant of 79. The material 34 that contacts the signal traces could be made of alumina, aluminum nitride, polyimide, FR4, or teflon. Alumina has a dielectric constant of 10. FR4 has a dielectric constant of about 4.2. Aluminum nitride has a dielectric constant of about 8.5. Polyimides have a dielectric constant of about 4 and teflon has a dielectric constant of about 2.1.

Note that if the decoupling capacitance of a package using Alumina between the power and ground plane is 1000 pF then a silicon carbide layer between the power and ground plane will have a capacitance of about 8000 pF. This means that, using the equation given above, the peak transient voltage will be 2.8 times less using silicon carbide rather than alumina.

Note that the power plane 28 is connected by a via 36 to a pin 38. This pin can be designated as the power pin of the package. In a similar fashion the signal traces 26 and the ground plane 30 can be electrically connected to signal and ground pins. Connections to the power and ground plane can be made by vias such as via.

The package 24 can be constructed by first forming a substrate layer out of the material 32. If the material 32 is silicon carbide or another type of ceramic, it can be formed out of green sheet material. The conductive plane which forms the ground plane 30 can be formed in a thick film or thin film process. A separation layer made of the material 32 can be placed on top of the conductive plane. Next, another conductive plane such as the power plane 28 can be formed on top of the separation layer. The separation layer will eventually provide the decoupling capacitance of the package. Note that the substrate layer does not need to be formed out of the same material as the separation layer. Next, a low dielectric constant material 34 is placed on top of the second conductive plane which is on the separation layer 32. Next, the I/O and signal traces can be placed upon the material 34. The package can be heated to harden and vias formed for the connection between levels and to the pins. Note that because two different types of dielectric constant material are used, this method of producing a package is different from the typical method used to produce the package shown in FIG. 2. As shown in FIG. 3., material 34 has a dielectric constant of less than 20 and material 32 has a dielectric constant of greater than 20.

FIG. 4 shows an alternate embodiment of the present invention where the material 32' with a high dielectric constant contacts the die 42 and 44 and the low dielectric constant material 34' is placed so as to contact the I/O and signal traces 26'. Holes could be dug into the unfired higher dielectric constant material 32 to form the spaces for the low dielectric constant material 34' and this low dielectric constant material 34' can be then placed within these holes before the package is fired. Using silicon carbide as the high dielectric constant material 32' is advantageous because this material has a high thermal conductivity of 260 W/mK compared to a thermal conductivity of 17 W/mK for alumina. The silicon carbide material can help transfer heat from the dies 42 and 44 to the rest of package.

FIG. 5 is a partial cross sectional view of another embodiment of the present invention. In this package, the power plane 50 and the signal traces 54 are on the same level. The ground plane 52 is on a separate level. The ground plane and power plane are separated by the high dielectric constant material 32" and the signal traces 54 are contacted by the low dielectric constant material 34".

Note that in all the above instances the conductive planes for the power plane and the ground plane could be reversed. For example, in FIG. 3, the power plane 28 could be a ground plane and the ground plane 30 could be a power plane.

Various details of the implementation and method are merely illustrative of the invention. It will be understood that various changes of details may be within the scope of the invention, which is to be limited only by the appended claims.

What is claimed is:

1. A multi-layer package with leads or pads comprising:
   conductive planes including a power plane electrically connected to a power lead or pad of the package and a ground plane electrically connected to a ground lead or pad of the package;
   signal traces electrically connected to signal leads or pads of the package;
   a first material arranged between and contacting the power plane and the ground plane, said first material having a dielectric constant greater than twenty; and
   a second material supporting said signal traces, said second material having a dielectric constant less than twenty wherein the first material has a higher thermal conductivity than said second material and wherein said first material contacts a die in said multi-layer package.

2. The multi-layer package of claim 1, wherein said second material is arranged between and contacts the signal traces and one of said conductive planes.

3. The multi-layer package of claim 1, wherein the first material forms a die bond pad for supporting the die.

4. The multi-layer package of claim 1, wherein the first material is silicon carbide.

5. The multi-layer package of claim 1, wherein second material is alumina.

6. The multi-layer package of claim 1, wherein second material has a dielectric constant less than ten.

7. The multi-layer package of claim 6, wherein second material is aluminum nitride.

8. The multi-layer package of claim 6, wherein second material has a dielectric constant less than five.

9. The multi-layer package of claim 8, wherein the second material is polyimide.

10. The multi-layer package of claim 8, wherein second material is FR4.

11. The multi-layer package of claim 8, wherein second material is Teflon.

12. The multi-layer package of claim 1, wherein said first material and said second material are ceramic.

13. A multi-layer package with leads or pads comprising:

conductive planes including a power plane electrically connected to a power lead or pad of the package and a ground plane electrically connected to a ground lead or pad of the package;

signal traces electrically connected to signal leads or pads of the package;

a silicon carbide layer arranged between and contacting the power plane and the ground plane, said silicon carbide layer forming a die bond pad adapted for contacting a die in the multilayer package so as to remove heat from the die; and another material supporting said signal traces, said second material having a dielectric constant less than twenty and a lower thermal conductivity than silicon carbide.

14. The multi-layer package of claim 13, wherein said another material is arranged between and contacts the signal traces and one of said conductive planes.

15. The multi-layer package of claim 13, wherein said another material is ceramic.

16. The multi-layer package of claim 13, further comprising a die attached to said die attach pad of the silicon carbide layer.

* * * * *